(12) United States Patent
Hirler et al.

(10) Patent No.: US 7,091,573 B2
(45) Date of Patent: Aug. 15, 2006

(54) POWER TRANSISTOR

(75) Inventors: Franz Hirler, Isen (DE); Jenoe Tihanyi, Kirchheim (DE); Ralf Henninger, München (DE); Joachim Krumrey, München (DE); Martin Poelzl, Ossiach (AT); Walter Rieger, Arnoldstein (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/666,228

(22) Filed: Sep. 18, 2003

(65) Prior Publication Data

US 2004/0089910 A1 May 13, 2004

Related U.S. Application Data

(63) Continuation-in-part of application No. 10/392,024, filed on Mar. 19, 2003, now Pat. No. 7,005,351.

(30) Foreign Application Priority Data

| Mar. 19, 2002 | (DE) | ................. 102 12 148 |
| Jul. 31, 2002 | (DE) | ................. 102 34 996 |
| Sep. 9, 2003 | (DE) | ................. 103 41 592 |

(51) Int. Cl.
- H01L 29/00 (2006.01)
- H01L 29/76 (2006.01)
- H01L 29/94 (2006.01)
- H01L 31/062 (2006.01)
- H01L 31/113 (2006.01)

(52) U.S. Cl. ..................................... 257/500; 257/330
(58) Field of Classification Search ............ 257/500–2, 257/501, 502, 330
See application file for complete search history.

(56) References Cited

U.S. PATENT DOCUMENTS

| 5,283,201 | A | 2/1994 | Tsang et al. |
| 5,801,417 | A | 9/1998 | Tsang et al. |
| 5,973,360 | A | 10/1999 | Tihanyi |
| 5,998,833 | A | 12/1999 | Baliga |
| 6,051,468 | A | 4/2000 | Hshieh |
| 6,191,447 | B1 | 2/2001 | Baliga |
| 6,198,127 | B1 | 3/2001 | Kocon |
| 6,605,841 | B1 * | 8/2003 | Lanzerstorfer et al. ..... 257/329 |
| 2004/0113202 | A1 * | 6/2004 | Kocon et al. ............... 257/330 |

FOREIGN PATENT DOCUMENTS

| DE | 100 38 177 A1 | 2/2002 |
| EP | 1 170 803 A2 | 1/2002 |
| WO | WO 97/00536 | 1/1997 |
| WO | WO 01/71817 A2 | 9/2001 |

* cited by examiner

*Primary Examiner*—Howard Weiss
(74) *Attorney, Agent, or Firm*—Laurence A. Greenberg; Werner H. Stemer; Ralph E. Locher

(57) ABSTRACT

The power transistor has a trench cell in a semiconductor body. A lower edge of the gate electrode has a profile which is not horizontal, i.e., not planar with respect to the field electrode.

8 Claims, 2 Drawing Sheets

POWER TRANSISTOR

CROSS-REFERENCE TO RELATED APPLICATION

This application is a continuation-in-part of our application Ser. No. 10/392,024, filed Mar. 19, 2003 now U.S. Pat No. 7,005,351. The earlier application is herewith incorporated by reference in its entirety.

BACKGROUND OF THE INVENTION

Field of the Invention

The invention lies in the semiconductor technology field. More specifically, the invention relates to a power transistor that has at least one trench transistor cell in a semiconductor body. A drain zone, a drift zone, a channel zone, and a source zone are formed in each case successively and substantially horizontally stacked in the semiconductor body. A trench is provided in the semiconductor body. The trench is clad substantially as far as a body height, which is opposite a pn junction between the drift zone and the channel zone in the semiconductor body with first dielectric layer and, between the body zone and the semiconductor body surface, with a gate oxide. A field electrode extends substantially from the trench base as far as the upper edge of the first dielectric layer and is arranged in the trench. A gate electrode is disposed approximately between the body height and the semiconductor body surface, and a second dielectric layer is disposed between the gate electrode and the field electrode.

Our earlier patent application describes a trench transistor cell in a semiconductor body wherein a drain zone, a drift zone, a channel zone (also referred as a body zone) and a source zone are in each case formed successively and essentially horizontally. There is also a trench in the semiconductor body, which is clad essentially as far as a body height, which is opposite a pn junction between the drift zone and the channel zone in the semiconductor body, with a first dielectric layer and, between the body height and the semiconductor body surface, with a gate oxide. A field electrode, which extends essentially from the trench base as far as the upper edge of the first dielectric layer, is arranged in the trench, a gate electrode is arranged approximately between the body height and the semiconductor body surface, and a dielectric layer is arranged between the gate electrode and the field electrode. This dielectric layer is at least as thick as the thinnest point in the gate oxide, at every point between the field electric and the gate electrode. However, the latter condition need not be satisfied for the device according to the present invention.

In earlier patent application, the standard gate electrode which is formed in the normal trench power transistors is thus subdivided into a field electrode in the lower region of the trench and the actual gate electrode in the upper region of the trench, approximately between the body height and the surface of the semiconductor body. The field electrode may in this case be at the source potential, or else at some other defined potential (in this context, see also U.S. Pat. No. 5,283,201 to Tsang et al.). This subdivision into a field electrode and a gate electrode allows the gate/drain capacitance of the trench transistor cell to be reduced. This is particularly true when care is taken to ensure that there is only a small overlapping region between the gate electrode and the drain zone.

In addition to having a small gate/drain capacitance, it is also preferable for power transistors to have a low switched-on resistance. This is the case, for example, when power transistors such as these are intended to be used in DC/DC converters. It is intrinsically possible to use the field plate principle in order to achieve a low switched-on resistance such as this (in this context, see commonly assigned U.S. Pat. No. 5,973,360 to Tihanyi).

In the case of the trench transistor cell described in the earlier patent application, the position of the lower edge of the gate electrode should match the position of the pn junction as exactly as possible, with the pn junction being formed between the drift zone and the channel zone, in an epitaxial layer which is provided on the semiconductor substrate. The epitaxial layer and the semiconductor substrate in this case form the semiconductor body. If the position of the lower edge of the gate electrode is too deep, this means that the overlap between the gate electrode and the drain zone is too great, and this intolerably increases the gate/drain capacitance. If, on the other hand, the position of the lower edge of the gate electrode is too high, that is to say the channel zone is too flat, then the inversion in the lower region of the channel zone is reduced, and the switched-on resistance is increased. In extreme situations, no channel is then any longer formed at all. Overall, this means that, if the lower edge of the gate electrode is inaccurately matched to the position of the pn junction between the drift zone and the channel zone, either the gate/drain capacitance increases as the overlap increases, or the formation of a channel is prevented by the channel zone being too flat.

For fast switching processes, it is also important for the field electrode to be connected to the source potential or to some other defined potential with as low an impedance as possible. This necessitates a very high conductance, which the field electrode must have in order to take account of the length of the trenches, which are in the form of strips or networks. In other words, a particularly highly doped polycrystalline silicon should preferably be used for the field electrodes.

Finally, in the case of trench transistor cells, the ratio between the gate/drain capacitance and the gate/source capacitance should in specific cases not be too high. This applies, for example, to a synchronization field-effect transistor in Buck converters since, in converters such as these, the gate can be switched on capacitively when the control field-effect transistor in the Buck converter is switched on.

SUMMARY OF THE INVENTION

Against the background of the trench transistor cell as described in our earlier patent application, it is accordingly an object of the invention to provide a power transistor, which overcomes the above-mentioned disadvantages of the heretofore-known devices and methods of this general type and which provides for a power transistor wherein a low gate/drain capacitance is ensured even if the lower edge of the gate electrode is less accurately matched to the pn junction between the drift zone and the channel zone.

With the foregoing and other objects in view there is provided, in accordance with the invention, a power transistor having at least one trench transistor cell in a semiconductor body, comprising:

a drain zone, a drift zone, a channel zone, and a source zone formed in each case successively and substantially horizontally in the semiconductor body;

the semiconductor body having a trench formed therein with a base and a defined body height opposite a pn junction between the drift zone and the channel zone;

a first dielectric layer cladding the trench substantially to the body height, and a gate oxide cladding the trench between the body zone and a semiconductor body surface; and a field electrode extending in the trench substantially from the trench base to an upper edge of the first dielectric layer;

a gate electrode disposed substantially between the body height and the semiconductor body surface, the gate electrode having a lower edge with a profile at least partly different from horizontal; and a second dielectric layer formed between the gate electrode and the field electrode.

In accordance with an added feature of the invention, the profile of the lower edge of the gate electrode is at least partly angled relative to the semiconductor body surface.

In accordance with an additional feature of the invention, the profile has a falling angle between two trenches.

In accordance with another feature of the invention, the profile of the lower edge of the gate electrode is formed with at least one outward bulge.

In accordance with a further feature of the invention, the field electrode overlaps the gate electrode.

In accordance with again an added feature of the invention, at least one of the field electrode and the gate electrode intersects and/or passes through a plane defined by the pn junction between the drift zone and the channel zone.

In accordance with a concomitant feature of the invention, the field electrode is connected to be at a fixed potential. In a further embodiment, the field electrode is at the source potential.

For a power transistor of the type mentioned initially, the objects of the invention are achieved in that the lower edge of the gate electrode has a non-horizontal profile, that is, it is not planar, at least in places.

In the power transistor according to the invention, the lower edge of the gate electrode therefore does not extend horizontally over its entire length; in fact, this lower edge has a profile which is not horizontal, at least in places. This may be achieved by the lower edge being angled at its edge, that is to say having an angled profile from its center.

If, in the power transistor according to the invention, the lower edge of the gate electrode is too deep with respect to the pn junction between the drift zone and the channel zone, then the greater layer thickness of the dielectric layer which is produced by the angle, that is to say preferably the thicker silicon dioxide, reduces the gate/drain capacitance in the lower region of the gate electrode. Conversely, if the lower edge of the gate electrode is arranged too high with respect to the pn junction, and the doping of the channel zone falls towards the pn junction, so that this results in a threshold voltage which decreases towards the pn junction, then the greater layer thickness of the dielectric layer is still sufficient in order to still form a channel in the lower region of the channel zone when the doping concentration is relatively low, provided that the lowermost part of the gate electrode is not completely immersed in the region of the channel zone.

Simulations have shown that, if the lower edge of the gate electrode is angled, the switched-on resistance rises only if the immersion depth beyond the plane of the pn junction is relatively small. In this case, even an angle of 15°, in comparison to the normal 90° at the edge of the gate electrode, is sufficient. A further advantage of the power transistor according to the invention is that its breakdown voltage is higher, since reductions in this breakdown voltage caused by corner effects are decreased by the flatter angle.

In order to increase the conductivity of the field electrode, it is advantageous to enlarge its cross-sectional area in its longitudinal extent by providing an inward bulge, that is to say a so-called "horseshoe shape" for the gate electrode. A shape such as this also has the advantage that the gate/source capacitance of the gate electrode is greater when the field electrode is at the source potential, so that the ratio of the gate/drain capacitance to the gate/source capacitance is better. An inward bulge such as this can also be combined with angled regions. Two or more inward bulges may also be provided.

Other features which are considered as characteristic for the invention are set forth in the appended claims.

Although the invention is illustrated and described herein as embodied in a power transistor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 4:
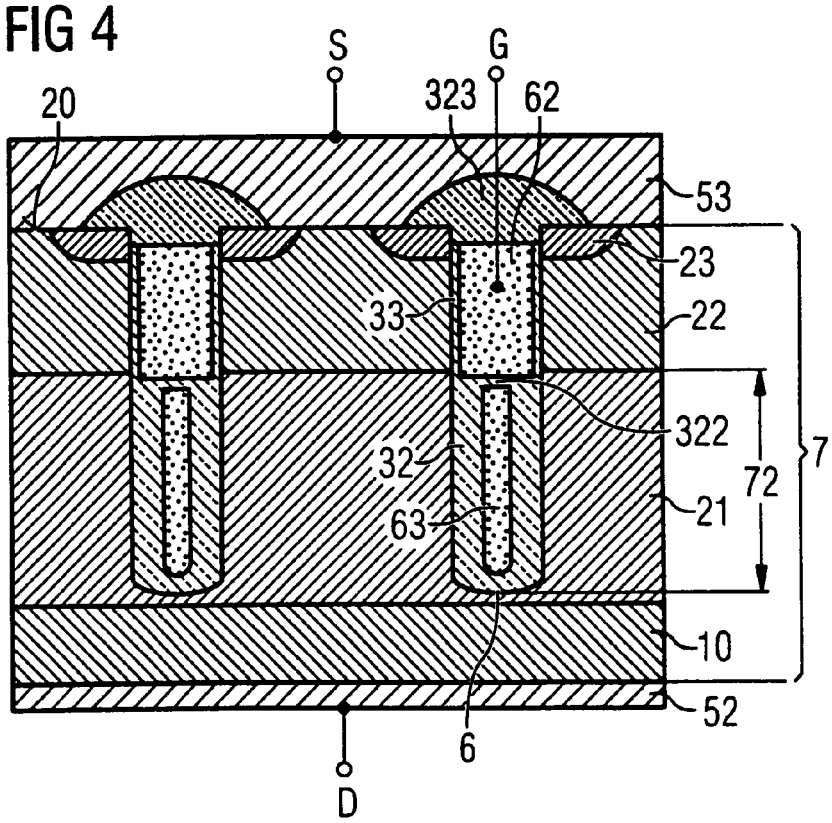
FIG. 4 is a section taken through a power transistor, based on a trench transistor cell according to our earlier patent application.

Referring now to the figures of the drawing in detail and first, particularly, to FIG. 4 thereof, there is shown a transistor cell according to the earlier copending application Ser. No. 10/392,024 which is incorporated herein. The transistor cell has a semiconductor body 7 composed of an $n^+$-conductive semiconductor substrate 10 and an epitaxial layer with an n-conductive drift zone 21, and a p-conductive channel or body zone 22, wherein an $n^+$-conductive source zone 23 is incorporated.

It should be noted that the stated conductivity types may each also be reversed without any problems. Instead of an $n^+$-conductive semiconductor substrate 10, this then results in a $p^+$-conductive semiconductor substrate with a p-conductive drift zone and an n-conductive body or channel zone, as well as a p-conductive source zone. Silicon is preferably used for the semiconductor body 7. However, other semiconductor materials may also be used, in particular such as silicon carbide SiC or compound semiconductors, and the like.

FIG. 4 also shows trenches 6 with a gate electrode 62 and a field electrode 63, both of which may be formed from doped polycrystalline silicon. These electrodes 62, 63 are insulated by way of insulating layers 32, 33 and 322, with the insulating layer 32 being thicker than the insulating layer 33, and the insulating layer 322 also preferably having a greater layer thickness than the insulating layer 33.

Silicon dioxide and/or silicon nitride are advantageously used for the insulating layers.

The insulating layer 33 thus forms a "gate oxide" for the gate electrode 62, while the insulating layer 32 represents the dielectric layer for the field electrode 63.

Finally, FIG. 4 also shows a drain connection metallization 52 for a drain electrode D, source connection metallization 53 for a source electrode S, an insulating layer 323 composed, for example, of silicon dioxide and/or silicon nitride between the gate electrode 62 and the source connection metallization 53 and a "body height" 72, wherein the pn junction runs, measured from the lower edge of the trench 6, between the drift zone 21 and the channel or body zone 22.

Various embodiment variants of the power transistor according to the invention will now be explained with reference to FIGS. 1 to 3. As required, the same reference symbols and numerals as in FIG. 4 are used for mutually corresponding components in these figures.

Figure 1:
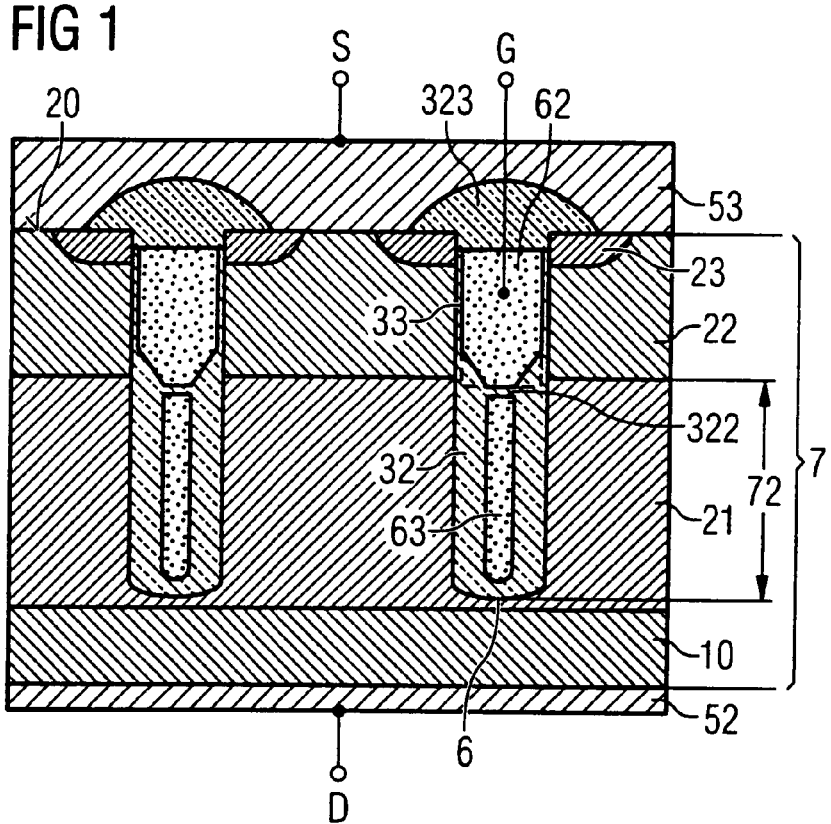
FIG. 1 is a section taken through one exemplary embodiment of the power transistor according to the invention.

The power transistor according to the invention and according to the exemplary embodiment shown in FIG. 1 is different to the power transistor of FIG. 4 in that the lower edge of the gate electrode 62 has a profile which is not horizontal, at least in places. In the exemplary embodiment shown in FIG. 1, this lower edge is obliquely angled, as can clearly be seen in the comparison to the existing profile (see the right-hand half of FIG. 1), which is indicated by dashed lines. In other words, at least in places, the lower edge is designed such that it falls away from the central "mesa region" between two trenches 6. If the gate electrode 62 is now too deep, then the thicker insulating layer 33 in the lower region of the gate electrode 62 reduces the gate/drain capacitance. Conversely, if the lower edge of the gate electrode 62 is too high and the channel zone 32 is doped such that it falls towards the pn junction between the zones 21, 22, thus resulting in a threshold voltage which decreases towards this pn junction, then the greater layer thickness of the insulating layer 33 is still sufficient to form a channel in the lower region of the channel zone 22 if the doping of the channel zone 22 is relatively low, provided that the lowermost part of the gate electrode is not completely surrounded by, or immersed in, the channel zone 22.

Figure 2:
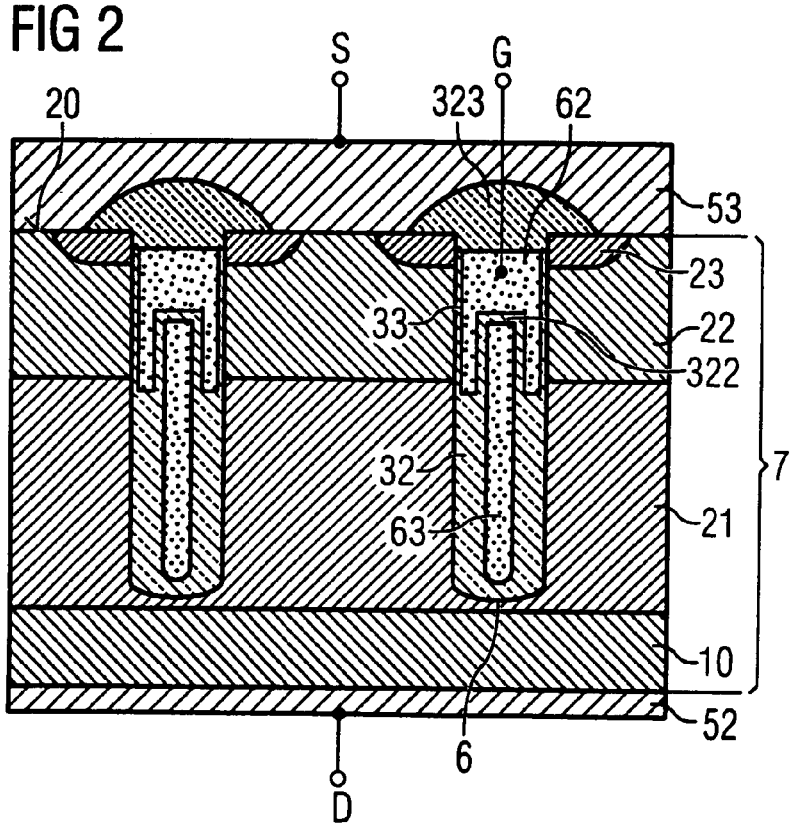
FIG. 2 is a section taken through a first variant of the exemplary embodiment shown in FIG. 1.
Figure 3:
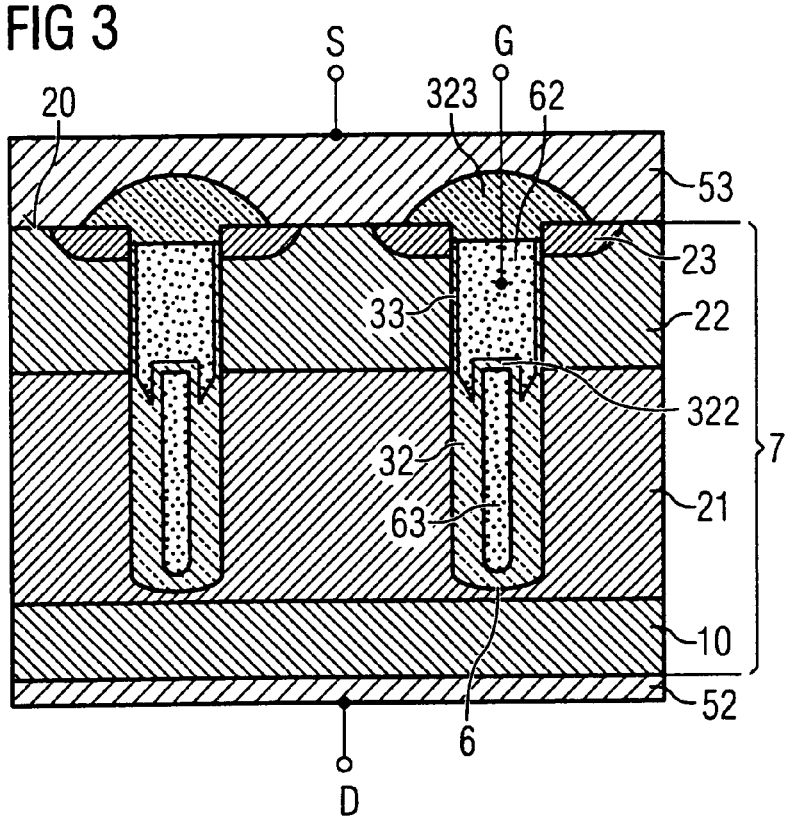
FIG. 3 is a section taken through a second variant of the exemplary embodiment shown in FIG. 1.

FIGS. 2 and 3 show yet more variants of the power transistor according to the invention, in each case in the form of section illustrations which are similar to the illustration shown in FIG. 1.

In this case, FIG. 2 shows a power transistor wherein the lower edge of the gate electrode 62 has a "horseshoe" shape, that is to say it assumes a shape wherein two jaws project at the edge, while the center has an inward bulge, which the field electrode 63 enters well beyond the pn junction between the zones 21 and 22.

In the same way, the "jaws" of the gate electrode 63 project downward beyond this pn junction.

Finally, FIG. 3 shows a variant wherein, in addition to the lower edge of the gate electrode 63 having a "horseshoe" shape, an angle is also provided for its outer edges. In this exemplary embodiment as well, the lower jaws of the gate electrode 62 and the upper edge of the field electrode 63 overhang the plane of the pn junction between the respective zone 21, 22, so that this plane is respectively intersected or passed through by the lower jaws 6 or the upper edge.

As noted in the introduction above, the instant application is a continuation-in-part of our copending patent application Ser. No. 10/392,024. Instead of physically including the entire text and the drawing figures of the earlier application, we herewith incorporate the entire disclosure thereof.

We claim:

1. A power transistor having at least one trench transistor cell in a semiconductor body, comprising:
   a drain zone, a drift zone, a channel zone, and a source zone formed in each case successively and substantially horizontally in the semiconductor body;
   the semiconductor body having a trench formed therein with a base and a defined body height opposite a pn junction between said drift zone and said channel zone;
   a first dielectric layer cladding said trench substantially to said body height, and a gate oxide cladding said trench between said body zone and a semiconductor body surface; and
   a field electrode extending in said trench substantially from said trench base to an upper edge of said first dielectric layer, said field electrode being connected to be at a fixed potential or at a source potential;
   a gate electrode disposed substantially between said body height and the semiconductor body surface, said gate electrode being electrically insulated from the semiconductor body by said gate oxide and having a lower edge with a profile, said profile having a horseshoe shape with two jaws projecting at edges thereof and a center between said jaws having an inward bulge in which said field electrode enters beyond said pn junction; and
   a second dielectric layer formed between said gate electrode and said field electrode.

2. The power transistor according to claim 1, wherein said field electrode overlaps said gate electrode.

3. The power transistor according to claim 1, wherein at least one of said field electrode and said gate electrode intersects and/or passes through a plane defined by said pn junction between said drift zone and said channel zone.

4. A power transistor having at least one trench transistor cell in a semiconductor body, comprising:
   a drain zone, a drift zone, a channel zone, and a source zone formed in each case successively and substantially horizontally in the semiconductor body;
   the semiconductor body having a trench formed therein with a base and a defined body height opposite a pn junction between said drift zone and said channel zone;
   a first dielectric layer cladding said trench substantially to said body height, and a gate oxide cladding said trench between said body zone and a semiconductor body surface; and
   a field electrode extending in said trench substantially from said trench base to an upper edge of said first dielectric layer, said field electrode being connected to be at a fixed potential or at a source potential;
   a gate electrode disposed substantially between said body height and the semiconductor body surface, said gate electrode being electrically insulated from the semiconductor body by said gate oxide and having a lower edge with a profile, said profile being at least partly obliquely angled relative to the semiconductor body surface, and said lower edge being provided above a top surface of said field electrode; and
   a second dielectric layer formed between said gate electrode and said field electrode.

5. The power transistor according to claim 4, wherein at least one of said field electrode and said gate electrode intersects and/or passes through a plane defined by said pn junction between said drift zone and said channel zone.

6. A power transistor having at least one trench transistor cell in a semiconductor body, comprising:

a drain zone, a drift zone, a channel zone, and a source zone formed in each case successively and substantially horizontally in the semiconductor body;

the semiconductor body having a trench formed therein with a base and a defined body height opposite a pn junction between said drift zone and said channel zone;

a first dielectric layer cladding said trench substantially to said body height, and a gate oxide cladding said trench between said body zone and a semiconductor body surface; and a field electrode extending in said trench substantially from said trench base to an upper edge of said first dielectric layer, said field electrode being connected to be at a fixed potential or at a source potential;

a gate electrode disposed substantially between said body height and the semiconductor body surface, said gate electrode being electrically insulated from the semiconductor body by said gate oxide and having a lower edge with a profile, said profile having a horseshoe shape with two jaws projecting at edges thereof and a center between said jaws having an inward bulge in which said field electrode enters, outer edges of said jaws being at least partly obliquely angled relative to the semiconductor body surface; and a second dielectric layer formed between said gate electrode and said field electrode.

7. The power transistor according to claim 6, wherein said field electrode overlaps said gate electrode.

8. The power transistor according to claim 6, wherein at least one of said field electrode and said gate electrode intersects and/or passes through a plane defined by said pn junction between said drift zone and said channel zone.

* * * * *